(12) United States Patent
Wang et al.

(10) Patent No.: US 11,088,174 B2
(45) Date of Patent: Aug. 10, 2021

(54) DISPLAY SUBSTRATE WITH GATE INSULATION LAYERS HAVING DIFFERENT THICKNESSES, MANUFACTURING METHOD OF THE SAME AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 56 days.

(21) Appl. No.: 16/618,935

(22) PCT Filed: Mar. 14, 2019

(86) PCT No.: PCT/CN2019/078074
§ 371 (c)(1),
(2) Date: Dec. 3, 2019

(87) PCT Pub. No.: WO2019/179348
PCT Pub. Date: Sep. 26, 2019

(65) Prior Publication Data
US 2020/0144306 A1    May 7, 2020

(30) Foreign Application Priority Data
Mar. 19, 2018    (CN) .......................... 201810223830.9

(51) Int. Cl.
*H01L 27/12* (2006.01)
*H01L 27/32* (2006.01)
*H01L 51/00* (2006.01)

(52) U.S. Cl.
CPC ........ *H01L 27/1237* (2013.01); *H01L 27/127* (2013.01); *H01L 27/1288* (2013.01); *H01L 27/3211* (2013.01); *H01L 27/3248* (2013.01); *H01L 51/0011* (2013.01)

(58) Field of Classification Search
CPC .................................................. H01L 27/1237
USPC ........................................................... 257/40
See application file for complete search history.

(56) References Cited

U.S. PATENT DOCUMENTS

| 6,388,504 B1 | 5/2002 | Goto et al. |
| 2007/0196986 A1* | 8/2007 | Ichige ............... H01L 27/11529 438/266 |
| 2008/0305622 A1 | 12/2008 | Kim |

(Continued)

FOREIGN PATENT DOCUMENTS

| CN | 101320712 A | 12/2008 |
| CN | 102033345 A | 4/2011 |

(Continued)

OTHER PUBLICATIONS

International Search Report and Written Opinion for Application No. PCT/CN2019/078074, dated Jun. 17, 2019, 10 Pages.

*Primary Examiner* — Ajay Arora
(74) *Attorney, Agent, or Firm* — Brooks Kushman P.C.

(57) ABSTRACT

A display substrate, a manufacturing method thereof and a display device are provided. The method of manufacturing a display substrate includes manufacturing a plurality of gate insulation layers having different thicknesses on a base substrate in one patterning process.

10 Claims, 5 Drawing Sheets

(56) References Cited

U.S. PATENT DOCUMENTS

2016/0307929 A1  10/2016  Zhang
2017/0323910 A1* 11/2017  Park .................... H01L 27/3265

FOREIGN PATENT DOCUMENTS

CN  104659285 A  5/2015
CN  108400151 A  8/2018

* cited by examiner

DISPLAY SUBSTRATE WITH GATE INSULATION LAYERS HAVING DIFFERENT THICKNESSES, MANUFACTURING METHOD OF THE SAME AND DISPLAY DEVICE

CROSS-REFERENCE TO RELATED APPLICATIONS

This application is the U.S. national phase of PCT Application No. PCT/CN2019/078074 filed on Mar. 14, 2019, which claims priority to Chinese Patent Application No. 201810223830.9 filed on Mar. 19, 2018 which are incorporated herein by, reference in their entireties.

TECHNICAL FIELD

The present disclosure relates to a field of a display technology, and in particular, relates to a display substrate, a manufacturing method of the display substrate and a display device.

BACKGROUND

An Organic Light Emitting Diode (OLED) technology has been widely used in a field of display and illumination, and has achieved abundant results. White Organic Light Emitting Diode (WOLED) is one of focuses in OLED research fields. In application, the white OLED may not only act as a lighting device directly, but also may be manufactured to be a backlight source in a liquid crystal display or be a full-color OLED display. In order to obtain white light, a three-primary-color theory may be used to mix red, green and blue luminescent dyes according to a certain proportion among them to produce the white light.

SUMMARY

The present disclosure provides a display substrate, a manufacturing method thereof and a display device.

In a first aspect, a method of manufacturing a display substrate is provided in the present disclosure. The method includes manufacturing a plurality of gate insulation layers having different thicknesses on a base substrate in one patterning process.

Optionally, manufacturing the plurality of gate insulation layers having different thicknesses on the base substrate in one patterning process, includes: forming a layer of gate insulation layer material on the base substrate; coating photoresist on the layer of gate insulation layer material; exposing the photoresist by using a mask, wherein the mask includes at least one of a light transmissible pattern, light partially-transmissible patterns having N light transmittances or a light shielding pattern, and N is an integer larger than or equal to 1; performing a development process and forming photoresist-reserved regions having N+1 different thicknesses and a photoresist-removed region; etching a part, corresponding to the photoresist removed region, of the layer of gate insulation layer material; removing the photoresist corresponding to a photoresist-reserved region having a minimum thickness among the photoresist-reserved regions having N+1 thicknesses; and etching a region, corresponding to the photoresist-reserved region having the minimum thickness, of the layer of gate insulation layer material, and repeating steps of removing the photoresist corresponding to the photoresist-reserved region having the minimum thickness and etching the region, corresponding to the photoresist-reserved region having the minimum thickness, of the layer of gate insulation layer material, until one photoresist-reserved region having a thickness is left; removing residual photoresist at a region, corresponding to the left one photoresist-reserved region having the thickness, of the layer of gate insulation layer material to form the gate insulation layers having N+1 thicknesses.

Optionally, manufacturing the plurality of gate insulation layers having different thicknesses on the base substrate in one patterning process, includes: manufacturing the plurality of gate insulation layers having different thicknesses and an active layer on the base substrate in one patterning process.

Optionally, manufacturing the plurality of gate insulation layers having different thicknesses and the active layer on the base substrate in one patterning process, includes: forming a layer of active layer material and a layer of gate insulation layer material on the base substrate sequentially; coating photoresist on the layer of gate insulation layer material; exposing the photoresist by using a mask, wherein the mask includes at least one of a light transmissible pattern, light partially-transmissible patterns having N+1 light transmittances or a light shielding pattern, and N is an integer larger than or equal to 1; performing a development process and forming photoresist-reserved regions having N+2 thicknesses and a photoresist-removed region; etching a part, corresponding to the photoresist removed region, of the layer of active layer material; removing the photoresist corresponding to a photoresist-reserved region having a minimum thickness among the photoresist-reserved regions having N+2 thicknesses; etching a region, corresponding to the photoresist-reserved region having the minimum thickness, of the layer of gate insulation layer material; and repeating the steps of removing the photoresist corresponding to the photoresist-reserved region having the minimum thickness, and etching the region, corresponding to the photoresist-reserved region having the minimum thickness, of the layer of gate insulation layer material, until one photoresist-reserved region having a thickness is left; removing residual photoresist at a region, corresponding to the left one photoresist-reserved region having the thickness, of the layer of gate insulation layer material and forming the gate insulation layers having N+1 thicknesses.

Optionally, after forming the gate insulation layers having N+1 thicknesses, the method further includes: performing, an electrically-conductive processing on a region, uncovered by the gate insulation layers, of the layer of active layer material to form a source contact region and a drain contact region of the active layer.

Optionally after forming the gate insulation layers having N+1 thicknesses, the method further includes: forming an electrically-conductive layer on the base substrate having the gate insulation layers having N+1 thicknesses; forming a source electrode, a drain electrode and a gate electrode of a thin film transistor based on the electrically-conductive layer in one patterning process, wherein the source electrode, the drain electrode and the gate electrode of the thin film transistor are insulated from each other.

Optionally, the electrically-conductive layer is a single-layer structure or a multi-layer structure.

In a second aspect, a display substrate manufactured by using the method in the above first aspect is provided. The display substrate includes a plurality of sub-pixels having different colors, wherein thicknesses of gate insulation layers of thin film transistors included in the sub-pixels having different colors are different.

Optionally, the plurality of sub-pixels having different colors includes at least a sub-pixel having a first color and a sub-pixel having a second color; the sub-pixel having the first color includes a first thin film transistor, the sub-pixel having the second color includes a second thin film transistor, and a transmittance of a color film having the first color to white light is smaller than that of a color film having the second color to the white light; and a thickness of a gate insulation layer of the first thin film transistor is smaller than that of a gate insulation layer of the second thin film transistor.

Optionally, each of the first thin film transistor or the second thin film transistor includes specifically: an active layer on a base substrate, wherein the active layer includes a source contact region, a drain contact region, and a channel region between the source contact region and the drain contact region; a gate insulation layer on the channel region; a source electrode on the source contact region; a drain electrode on the drain contact region; and a gate electrode on the gate insulation layer.

In a third aspect, a display device is provided in the present disclosure. The display device includes the display substrate according to the second aspect.

REFERENCE SIGNS 1. base substrate
2. an active layer
21. a source contact region
22. a drain contact region
3. a gate insulation layer
4. a mask
41. a first light partially-transmissible pattern
42. a second light partially-transmissible pattern
43. a third light partially-transmissible pattern
44. a fourth light partially-transmissible pattern
45. a light transmissible pattern
5. photoresist
6. an electrically-conductive layer
61. a source electrode
62. a drain electrode
63. a gate electrode
A. first thin film transistor
B. second thin film transistor
C. third thin film transistor

DETAILED DESCRIPTION

In order to make an objective, a technical solution and an advantage of the present disclosure clearer, the embodiments of the present disclosure will be illustrated in detail hereinafter with reference to the accompanying drawings and specific embodiments.

In a WOLED display panel, the white light emitted by a light-emitting layer passes through three kinds of color films: a red color film, a green color film and a blue color film, thus realizing a color display. However, transmittances of the red color film, the green color film and the blue color film to the white light are different. In order to obtain red light, green light and blue light with a same luminance, it is necessary to provide different driving currents for thin film transistors corresponding to a red sub-pixel, a green sub-pixel and a blue sub-pixel. In this way, the thin film transistors corresponding to the red sub-pixel, the green sub-pixel and the blue sub-pixel must adopt different width-to-length ratios. Therefore, different sub-pixels occupy different areas on a display panel. For example, transmittances of the red color film and the blue color film to the white light are relatively smaller. In order to enable the red sub-pixel and the blue sub-pixel to have a same luminance as that of the green sub-pixel, it is necessary to provide larger on-state currents for the red sub-pixel and the blue sub-pixel. Thus, the thin film transistors corresponding to the red sub-pixel and the blue sub-pixel will occupy larger areas in design, which makes it difficult to further improve a resolution of a large-size OLED display.

Some embodiments of the present disclosure provide a display substrate, a manufacturing method thereof and a display device. The display substrate, the manufacturing method thereof and the display device may manufacture driving thin film transistors with different on-state currents on the same display substrate to drive sub-pixels with different luminous efficiencies, thereby improving a resolution of an OLED display device.

When an OLED display substrate emits light, a driving thin film transistor is in a saturated region and a leakage current of the driving thin film transistor reaches a saturated value. A formula for the on-state current may be expressed as follows:

$$I_{DS} = \frac{W}{2L}\mu_n C_{OX}(V_{GS} - V_{TH})^2$$

wherein, $I_{DS}$ is the on-state current of a driving thin film transistor; W is a channel width of the driving thin film transistor; L is a channel length of the driving thin film transistor; $\mu_n$ a field effect mobility; $C_{OX}$ is a capacitance of a gate insulation layer per unit area, which is inversely proportional to a thickness of the gate insulation layer; $V_{TH}$ is a threshold voltage of the driving thin film transistor; $V_{GS}$ is a voltage between a gate electrode and a source electrode of the driving thin film transistor. When the thickness of the gate insulation layer is larger and other parameters remain unchanged, the Cox is smaller, the $V_{TH}$ is larger and the IDS is smaller; when the thickness of the gate insulation layer is smaller and other parameters remain unchanged, the Cox is larger, the $V_{TH}$ is smaller and the $I_{DS}$ is larger. Therefore, under a condition that the channel width-length ratios of the driving thin film transistors are the same, the on-state currents of the driving thin film transistors with the gate insulation layers of different thicknesses are different, and the driving thin film transistors may be used for driving sub-pixels having different luminous efficiencies.

When the gate insulation layer is made of silicon oxide, $$C_{OX} = \frac{\varepsilon_0 \varepsilon_{SiOx}}{d_{SiOx}},$$

$d_{SiOx}$ is a thickness of the silicon oxide, $\varepsilon_0$ is a vacuum dielectric constant, $\varepsilon_{SiOx}$ is a dielectric constant of the silicon oxide.

Some embodiments of the present disclosure provide a method of manufacturing a display substrate. The method includes a step of manufacturing a thin film transistor on a base substrate. The thin film transistor may be a driving transistor including a gate insulation layer. The driving transistor may be a top-gate type transistor or a bottom-gate type transistor.

The manufacturing method specifically includes: manufacturing a plurality of gate insulation layers having different thicknesses on a base substrate in one patterning process.

The gate insulation layers having different thicknesses may be manufactured by performing one patterning process. Different thicknesses of the gate insulation layers will lead to different on-state currents of driving thin film transistors, so that the gate insulation layers of the driving thin film transistors having different on-state currents may be manufactured by performing one patterning process. Since multiple patterning processes are not needed to manufacture the gate insulation layers having different thicknesses, a quantity of patterning processes and a production time for manufacturing the display substrate may be saved, and a cost may be reduced. The driving thin film transistors having different on-state currents may be used for driving sub-pixels with different luminous efficiencies to achieve a same display effect. The present disclosure changes the on-state currents of the driving thin film transistors by changing the thicknesses of the gate insulation layers, rather than by changing a channel area of a driving thin film transistor. The present disclosure may also improve a resolution of an OLED display device.

Manufacturing the gate insulation layers having different thicknesses on the base substrate in one patterning process may specifically include following step S101-step S107.

Step S101: forming a layer of a gate insulation layer material on the base substrate.

Step S102: coating photoresist on the layer of gate insulation layer material.

Step S103: exposing the photoresist by using a mask, wherein the mask includes at least one of a light transmissible pattern, light partially-transmissible patterns with N light transmittances or a light shielding pattern, and N is an integer larger than or equal to 1.

Step S104: performing a development process and forming photoresist-reserved regions having N+1 different thicknesses and a photoresist-removed region.

Step S105: etching a part, corresponding to the photoresist removed region, of the layer of gate insulation layer material.

Step S106: removing the photoresist corresponding to a photoresist-reserved region having a minimum thickness among the photoresist-reserved regions having N+1 thicknesses; and etching a region, corresponding to the photoresist-reserved region having the minimum thickness, of the layer of gate insulation layer material, and repeating the above steps of removing, the photoresist corresponding to a photoresist-reserved region having a minimum thickness and etching a region, corresponding to the photoresist-reserved region having the minimum thickness, of the layer of gate insulation layer material, until one photoresist-reserved region having a thickness is left.

Step S107: removing residual photoresist at a region of the layer of gate insulation layer material to form the gate insulation layers having N+1 thicknesses.

A quantity of the thicknesses of the gate insulation layer may be determined as required. For example, in a case that the display substrate includes three sub-pixels with different luminous efficiencies, gate insulation layers having three different thicknesses may be needed, thereby manufacturing driving thin film transistors having three different on-state currents.

Optionally, each of the driving thin film transistors may further include an active layer, the manufacturing method includes specifically: manufacturing the gate insulation layers having different thicknesses and the active layer on the base substrate in one patterning process.

In the present disclosure, since the gate insulation layers having different thicknesses and the active layer are manufactured in one patterning process, multiple patterning processes are not needed for manufacturing the gate insulation layers having different thicknesses and the active layer, thus a quantity of the patterning processes and production time for manufacturing the display substrate may be saved, and a cost may be reduced.

Further, manufacturing the gate insulation layers having different thicknesses and the active layer on the base substrate in one patterning process may include the following step S201-step S207 specifically.

Step S201: forming a layer of active layer material and the layer of gate insulation layer material on the base substrate sequentially.

Step S202: coating photoresist on the layer of gate insulation layer material.

Step S203: exposing the photoresist by using a mask, wherein the mask includes at least one of a light transmissible pattern, light partially-transmissible patterns with N+1 light transmittances or a light shielding pattern, and N is an integer larger than or equal to 1.

Step S204: performing a development process and forming photoresist-reserved regions having N+2 thicknesses and a photoresist-removed region.

Step S205: etching a part, corresponding to the photoresist removed region, of the layer of active layer material.

Step S206: removing the photoresist corresponding to a photoresist-reserved region having a minimum thickness among the photoresist-reserved regions having N+2 thicknesses; etching a region, corresponding to the photoresist-reserved region having the minimum thickness, of the layer of gate insulation layer material; and repeating the above steps of removing the photoresist corresponding to a photoresist-reserved region having a minimum thickness, and etching a region, corresponding to the photoresist-reserved region having the minimum thickness, of the layer of gate insulation layer material, until one photoresist-reserved region having a thickness is left.

Step S207: removing residual photoresist at a region, corresponding to the left one photoresist-reserved region having a thickness, of the layer of gate insulation layer material to form the gate insulation layers having N+1 thicknesses.

In the example, the active layer and the gate insulation layers are formed on the base substrate sequentially, which may effectively reduce interface states between the gate insulation layers and the active layer and improve device characteristics of the driving thin film transistors.

Further, after forming the gate insulation layers having N+1 thicknesses, the method may further include a step S208.

Step S208: performing, a conductive processing on a region, uncovered by the gate insulation layers, of the layer of active layer material to form a source contact region and a drain contact region of the active layer.

After performing the conductive processing on the active layer, conductivities of the source contact region and the drain contact region of the active layer may be improved, and device characteristics of the driving thin film transistors may be improved. The conductive processing performed on the active layer includes, but is not limited to, a plasma processing.

Further, after forming the gate insulation layers having N+1 thicknesses, the method may further include steps S209-S210.

Step S209: forming, an electrically-conductive layer on the base substrate after forming the gate insulation layers having N+1 thicknesses.

Step S210: forming a source electrode, a drain electrode and a gate electrode of a thin film transistor based on the electrically-conductive layer in one patterning process, wherein the source electrode, the drain electrode and the gate electrode of the driving thin film transistor are insulated from each other.

In the example, the source electrode, the drain electrode and the gate electrode of the driving thin film transistor may be manufactured by performing one patterning process. Since multiple patterning processes for manufacturing the gate electrode, the source electrode and the drain electrode are not needed, a quantity of the patterning processes and production time for manufacturing the display substrate may be further saved, and a cost may be reduced.

The method of manufacturing the display substrate of the present disclosure will be described in detail hereinafter reference to the accompanying drawings and specific embodiments by taking as an example a case in which the gate insulation layers having three different thicknesses are manufactured. The method of manufacturing the display substrate of the present disclosure may include following steps.

Figure 1:
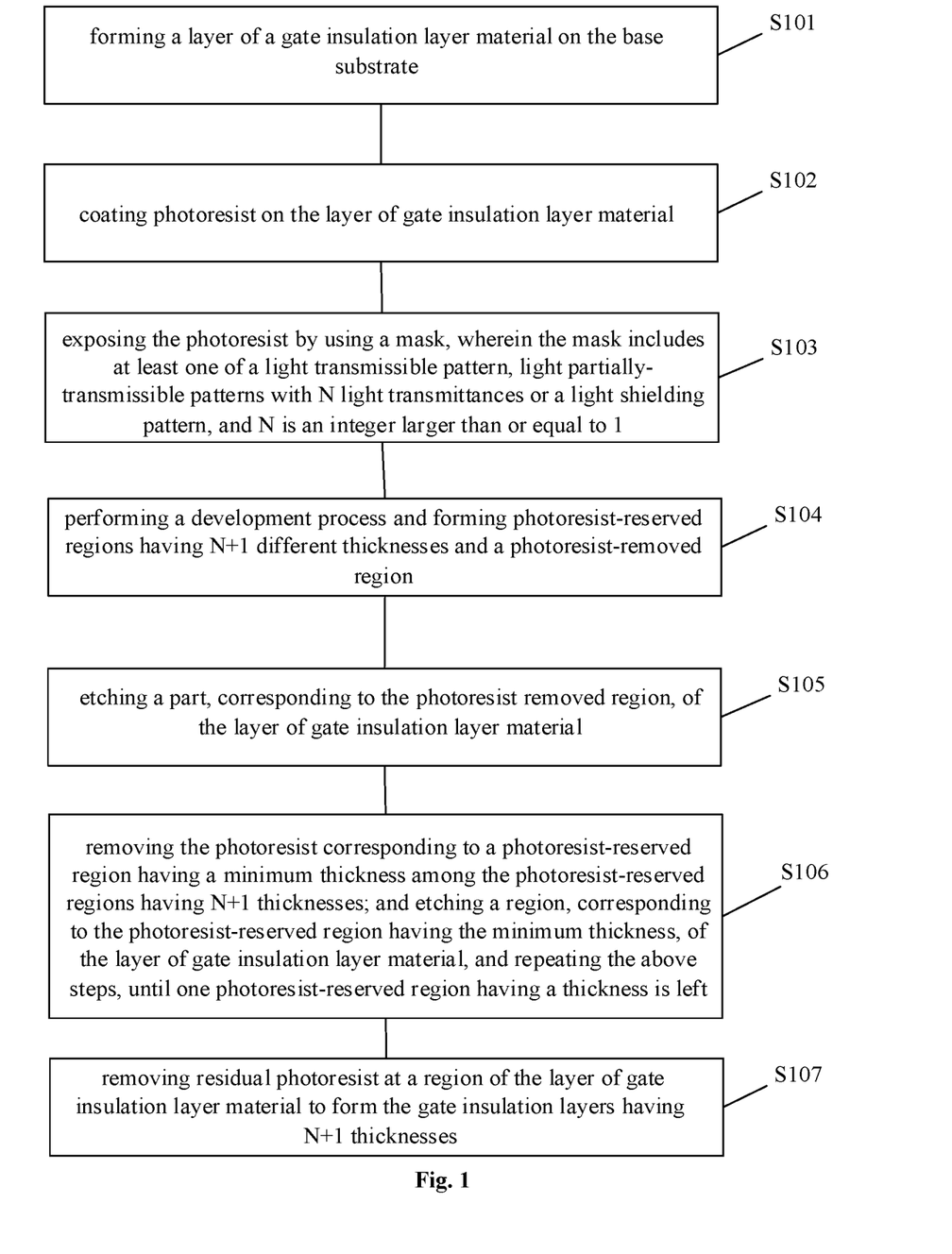
FIG. 1-FIG. 2 are flowcharts illustrating a method of manufacturing a display substrate according to some embodiments of the present disclosure.
Figure 2:
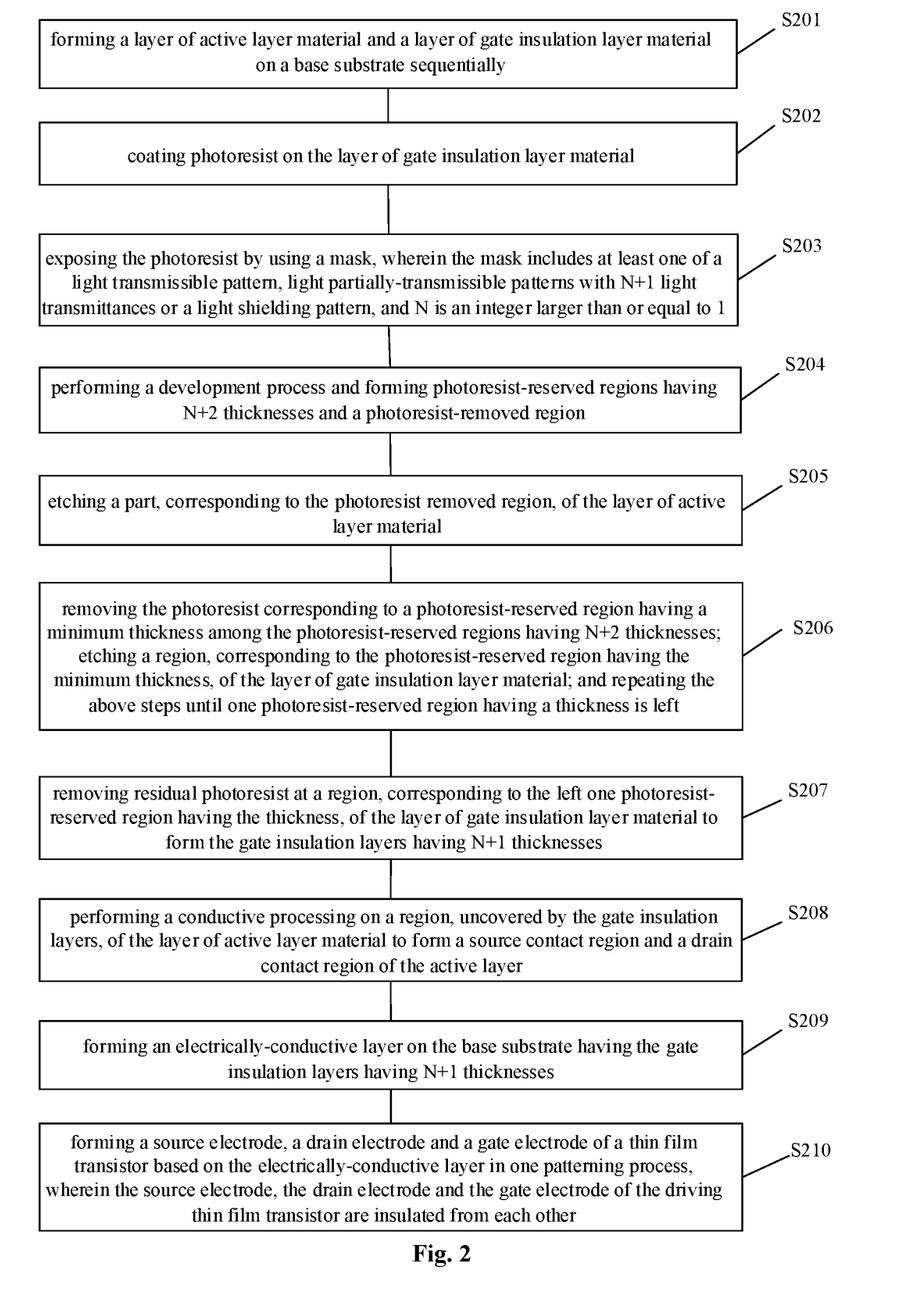
Figure 3:
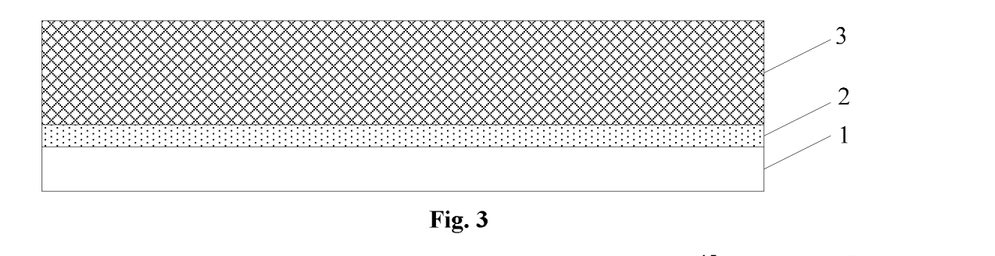
FIG. 3-FIG. 9 are schematic diagrams illustrating a structure of a thin film transistor manufactured by a method of manufacturing a display substrate according to some embodiments of the present disclosure.

Step 1: as shown in FIG. 3, providing a base substrate 1, and forming an active layer 2 and a layer 3 of gate insulation layer material on the base substrate 1.

The base substrate 1 may be a glass substrate or a quartz substrate. The base substrate 1 may be cleaned, and after cleaning the base substrate 1, the active layer 2 and the layer 3 of gate insulation layer material may be formed on the base substrate 1 sequentially.

The active layer may be made of oxides, silicon and organic materials. Specifically, the active layer 2 may be made of a-IGZO, ZnON, IZTO, a-Si, p-Si, hexathiophene, polythiophene, etc.

After forming the active layer 2, a layer 3 of gate insulation layer material having a thickness of 500 Å-5000 Å may be deposited on the active layer 2 by using a Plasma Enhanced Chemical Vapor Deposition (PECVD) method. The layer 3 of gate insulation layer material may be made of oxides, nitrides or oxygen-nitrogen compounds, such as SiOx, SiNx, SiON, etc. Corresponding reaction gases are $SiH_4$, $NH_3$, $N_2$ or $SiH_2Cl_2$, $NH_3$, $N_2$. The layer 3 of gate insulation layer material may also be made of an organic insulation material or a high-dielectric-constant (High k) material such as AlOx, HfOx, TaOx, etc.

Figure 4:
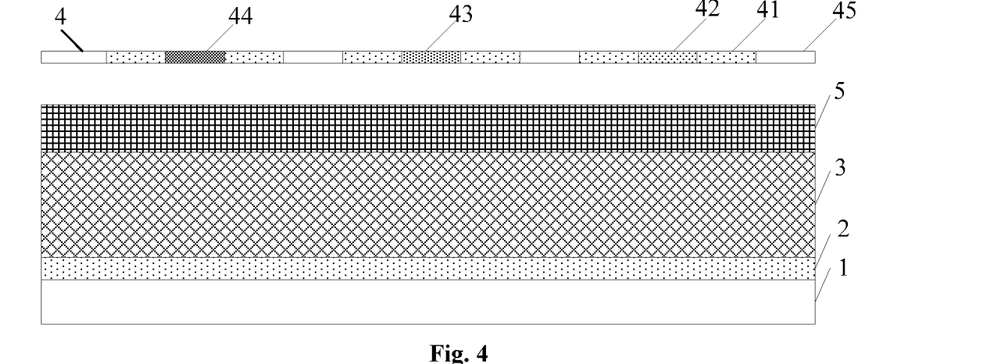

Step 2: as shown in FIG. 4, coating a photoresist 5 to the layer 3 of the gate insulation layer material, and exposing the photoresist 5 by using a mask 4.

As shown in FIG. 4, the mask 4 includes a first light partially-transmissible pattern 41, a second light partially-transmissible pattern 42, a third light partially-transmissible pattern 43, a fourth light partially-transmissible pattern 44 and a light transmissible pattern 45. A light transmittance of the first light partially-transmissible pattern 41 is larger than that of the second light partially-transmissible pattern 42, the light transmittance of the second light partially-transmissible pattern 42 is larger than that of the third light partially-transmissible pattern 43, the light transmittance of the third light partially-transmissible pattern 43 is larger than that of the fourth light partially-transmissible pattern 44.

Figure 5:
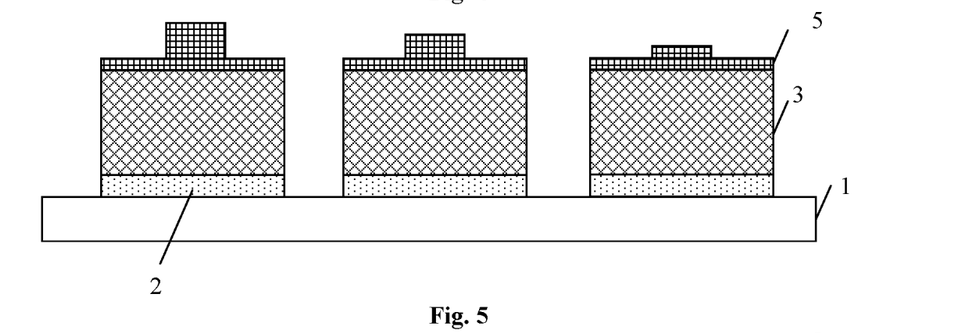

Step 3: as shown in FIG. 5, forming photoresist-reserved regions having four thicknesses and a photoresist-removed region after a development is performed, etching parts, corresponding to the photoresist-removed region, of the active layer 2 and the layer 3 of gate insulation layer material, wherein the photoresist-reserved regions correspond to the first light partially-transmissible pattern 41 to the fourth light partially-transmissible pattern 44, the photoresist-removed region corresponds to the light transmissible pattern 45.

Figure 6:
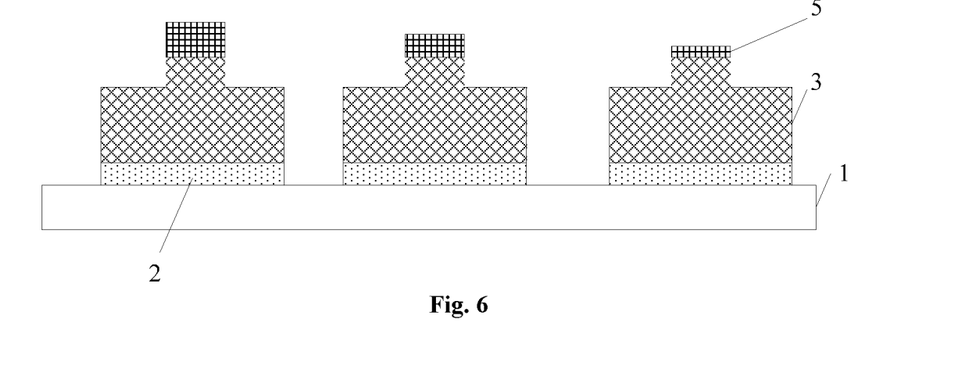

Step 4: as shown in FIG. 6, ashing a part, corresponding to the photoresist-reserved region having a minimum thickness, of the layer 3 of the gate insulation layer material, and then etching a part, uncovered by the photoresist, of the layer 3 of gate insulation layer material. In such a case, photoresists with three different thicknesses are remained on the layer 3 of gate insulation layer material.

Figure 7:
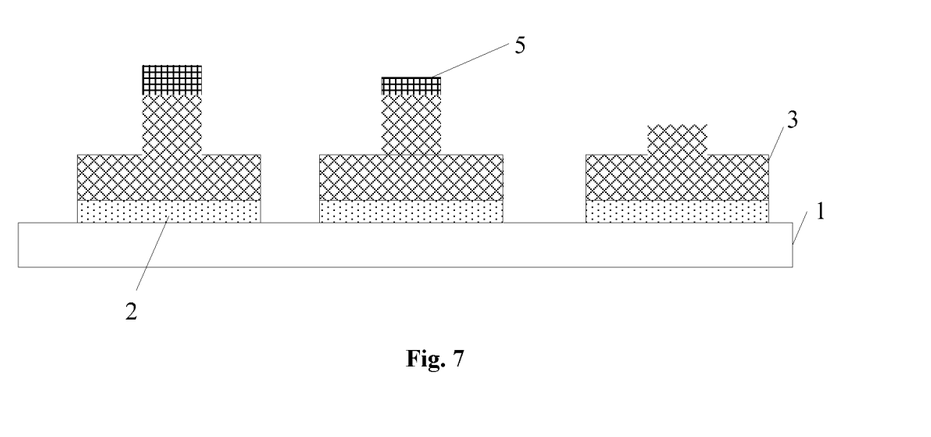

Step 5: as shown in FIG. 7, etching a part, corresponding to the photoresist-reserved region having the minimum thickness, of the layer 3 of gate insulation layer material, and then etching a part, uncovered by the photoresist, of the layer 3 of gate insulation layer material. In such a case, photoresists with two different thicknesses are remained on the layer 3 of gate insulation layer material.

Figure 8:
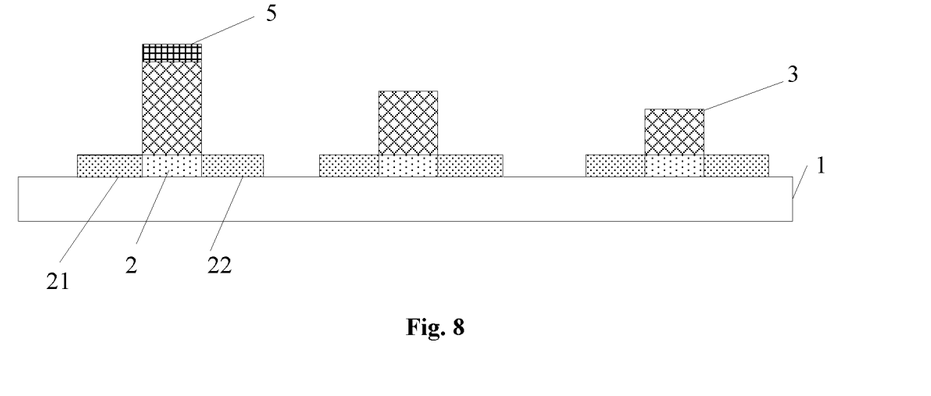

Step 6: as shown in FIG. 8, ashing a part, corresponding to the photoresist-reserved region having the minimum thickness, of the layer 3 of gate insulation layer material, and then etching a part, uncovered by the photoresist, of the layer 3 of gate insulation layer material. In such a case, a photoresist having one thickness is remained on the layer 3 of gate insulation layer material.

It can be seen that gate insulation layers 3 having three different thicknesses are formed on the base substrate 1, the active layer 2 includes regions uncovered by the gate insulation layers 3. A conductive processing may be performed on the regions, uncovered by the gate insulation layers 3, of the active layer 2 to form a source contact region 21 and a drain contact region 22.

Figure 9:
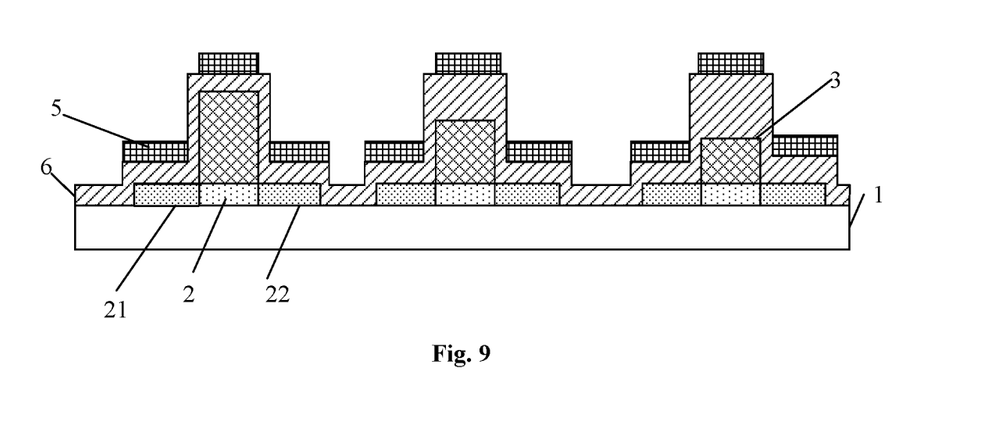

Step 7: as shown in FIG. 9, removing residual photoresist 5, forming an electrically-conductive layer 6 on the base substrate 1 where the gate insulation layers 3 having three different thicknesses are formed, coating a photoresist onto a part of the electrically-conductive layer 6, exposing and developing the photoresist to form photoresist-removed regions and photoresist-reserved regions.

Specifically, an electrically-conductive layer 6 having a thickness of 500 Å-4000 Å may be deposited on the base substrate 1 through sputtering or thermal evaporation processes. The electrically-conductive layer 6 may be made of Cu, Al, Ag, Mo, Cr, Nd, Ni, Mn, Ti, Ta, W or alloys of the metals described above. The electrically-conductive layer 6 may also be a single-layer structure or a multi-layer structure such as Cu\Mo, Ti\Cu\Ti, Mo\Al\Mo, etc. The electrically-conductive layer 6 may also be a stack structure such as ITO/Ag/ITO formed by metals and transparent conductive oxides (such as ITO, AZO, etc.).

The electrically-conductive layer 6 may be coated with a layer of the photoresist 5. The photoresist is exposed by using the mask to form the photoresist-removed regions and the photoresist-reserved regions. The photoresist-removed regions correspond to regions where a source electrode 61, a drain electrode 62 and a gate electrode 63 of the driving thin film transistor are located, and the photoresist-reserved regions correspond to regions other than the regions. A development process is performed, the photoresist in the photoresist-removed regions are fully removed, and thicknesses of the photoresist-reserved regions remain unchanged.

Figure 10:
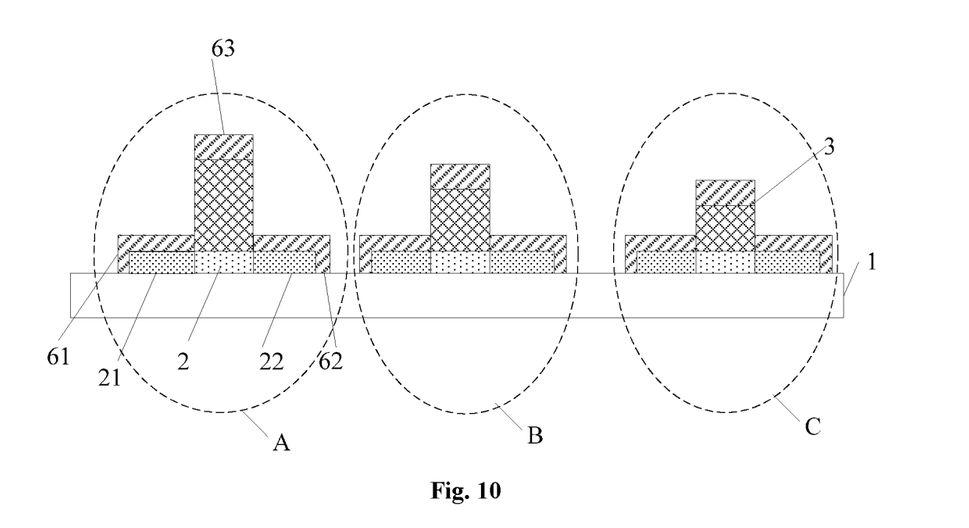
FIG. 10 is a schematic diagram illustrating a structure of a display substrate according to some embodiments of the present disclosure.

Step 8: as shown in FIG. 10, etching parts, corresponding to the photoresist-removed regions, the electrically-conductive layer 6 to form the source electrode 61, the drain electrode 62 and the gate electrode 63 of the driving thin film transistor; stripping off remaining photoresist 5 to form a first thin film transistor A, a second thin film transistor B and a third thin film transistor C, wherein thicknesses of gate insulation layers of the first thin film transistor A, the second thin film transistor B and the third thin film transistor C are different. Since the thicknesses of the gate insulation layers are different, on-state currents of the first thin film transistor A, the second thin film transistor B and the third thin film transistor C are different. The thickness of the gate insulation layer of the first thin film transistor A is the largest, and the on-state current of the first thin film transistor A is the smallest, thus the first thin film transistor A is suitable for a sub-pixel having a highest luminous efficiency. The thickness of the gate insulation layer of the third thin film transistor C is the smallest, and the on-state current of the third thin film transistor C is the largest, thus the third thin film transistor C is suitable for a sub-pixel having a smallest luminous efficiency.

The driving thin film transistor on the display substrate may be manufactured through the steps 1-8 described above, and then a planarization layer, an anode, a pixel defining layer, a light-emitting layer and a cathode may be manufactured to obtain the display substrate. The method of manufacturing the display substrate of the present disclosure may be applied to manufacture a metal-oxide-technology based display substrate, a silicon-technology based display substrate and an organic-matter-technology based display substrate. The display substrate manufactured by the present disclosure may be a bottom-emitting type display substrate, or a top-emitting type display substrate and the display substrate may be applied to a flexible display.

In the present disclosure, the gate insulation layers having different thicknesses may be manufactured by performing one patterning process. Different thicknesses of the gate insulation layers will lead to different on-state currents of driving thin film transistors, so that the gate insulation layers of the driving thin film transistors having different on-state currents may be manufactured by performing one patterning process. Since multiple patterning processes are not needed to form the gate insulation layers having different thicknesses, a quantity of the patterning processes and production time for manufacturing the display substrate may be saved, and a cost may be reduced. The driving thin film transistors having different on-state currents may be used for driving sub-pixels having different luminous efficiencies and a same display effect may be achieved. Moreover, the present disclosure changes the on-state currents of driving thin film transistors by changing the thicknesses of the gate insulation layers, instead of changing channel areas of the driving thin film transistors. The present disclosure may also improve a resolution of an OLED display device.

Some embodiments of the present disclosure further provide a display substrate. The display substrate may be manufactured by using the method described above. The display substrate may include a plurality of sub-pixels having different colors. Thicknesses of gate insulation layers of driving thin film transistors included in the sub-pixels having different colors are different.

In the present disclosure, the thicknesses of gate insulation layers of the driving thin film transistors included in the sub-pixels having different colors are different. Different thicknesses of the gate insulation layers will lead to different on-state currents of the driving thin film transistors. The driving thin film transistors having different on-state currents may be used for driving sub-pixels having different luminous efficiencies, and a same display effect may be achieved. The present disclosure changes the on-state currents of driving thin film transistors by changing the thicknesses of the gate insulation layers, instead of changing channel areas of the driving thin film transistors. The present disclosure may also improve a resolution of an OLED display device.

Further, the plurality of sub-pixels having different colors includes at least a sub-pixel having a first color and a sub-pixel having a second color. The sub-pixel having the first color includes a first driving thin film transistor, the sub-pixel having the second color includes a second driving thin film transistor, and a transmittance of a first-color color film to white light is smaller than that of a second-color color film to the white light. A thickness of the gate insulation layer of the first driving thin film transistor is smaller than that of the gate insulation layer of the second driving thin film transistor.

The smaller the transmittance of a color film to the white light is, the smaller the luminous efficiency of a corresponding sub-pixel is. Accordingly, the on-state current of the corresponding driving thin film transistor of the corresponding sub-pixel needs to be relatively large, and the thickness of the gate insulation layer of the corresponding driving thin film transistor needs to be relatively small in design.

In a specific embodiment, the driving thin film transistor may include: an active layer on a base substrate, wherein the active layer includes a source contact region, a drain contact region, and a channel region between the source contact region and the drain contact region; a gate insulation layer on the channel region; a source electrode on the source contact region; a drain electrode on the drain contact region; and a gate electrode on the gate insulation layer.

Some embodiments of the present disclosure further provide a display device. The display device includes a display substrate described above. The display device may be any product or component with a display function, such as a TV, a display, a digital photo frame, a mobile phone, a tablet computer, etc. The display device also includes a flexible circuit board, a printed circuit board and a backplate.

In the present disclosure, the thicknesses of gate insulation layers of the driving thin film transistors included in the sub-pixels having different colors are different. Different thicknesses of the gate insulation layers will lead to different on-state currents of the driving thin film transistors. The driving thin film transistors having different on-state currents may be used for driving sub-pixels having different luminous efficiencies, and a same display effect may be achieved. The present disclosure changes the on-state currents of driving thin film transistors by changing the thicknesses of the gate insulation layers, instead of changing channel areas of the driving thin film transistors. The present disclosure may also improve a resolution of an OLED display device.

Some embodiments of the present disclosure have following beneficial effects. in the above technical solution, the gate insulation layers having different thicknesses may be manufactured by performing one patterning process. Different thicknesses of the gate insulation layers will lead to different on-state currents of the driving thin film transistors, so that the gate insulation layers of the driving thin film transistors having different on-state currents may be manufactured by performing one patterning process. Since multiple patterning processes are not needed to manufacture the gate insulation layers having different thicknesses, a quantity of patterning processes and a production time for manufacturing the display substrate may be saved, and a cost may be reduced. The driving thin film transistors having different on-state currents may be used for driving sub-pixels having different luminous efficiencies, and a same display effect may be achieved. The present disclosure changes the on-state currents of the driving thin film transistors by changing the thicknesses of the gate insulation layers, rather than by changing an area of a driving thin film transistor. The present disclosure may also improve a resolution of an OLED display device.

In each method embodiment of the present disclosure, sequence numbers of the steps described may not be used for defining a sequence of the steps, a variation of the sequence of the steps is also within the protection scope of the present disclosure for those skilled in the art without paying any creative work.

Unless defined otherwise, technical or scientific terms in the embodiments of the present disclosure shall be of general meanings understood by those skilled in the art. Terms "first", "second" and similar terms in the embodiments of the present disclosure do not indicate any order, quantity or importance, but are used only for distinguishing different components. A term "include", "comprise" or other term with similar meaning indicates that components or objects before the term cover components, objects or other equivalents listed after the term, and does not exclude other components or objects. A term "connect", "attach" or other term with similar meaning is not limited to a physical connection or a mechanical connection, but may include an electrical connection, whether a direct connection or an indirect direction. Such words as "up", "down", "left", "right" and so on are only used to represent a relative positional relationship. When an absolute position of a described object is changed, the relative positional relationship may also change accordingly.

It is understandable that when a component such as a layer, film, region or substrate is said to be located "above" or "below" another component, the component may be "directly" located "above" or "below" the another component, or intermediate components may exist.

The embodiments described above are optional embodiments of the present disclosure. It should be pointed out that those skilled in the art may make various modifications and changes without departing from the spirit and the scope of the present disclosure. The modifications and changes shall also be regarded as the protection scope of the present disclosure.

What is claimed is:

1. A method of manufacturing a display substrate, comprising:
   manufacturing a plurality of gate insulation layers having different thicknesses on a base substrate in one patterning process wherein manufacturing the plurality of gate insulation layers having different thicknesses on the base substrate in one patterning process, comprises:
   forming a layer of gate insulation layer material on the base substrate;
   coating photoresist on the layer of gate insulation layer material;
   exposing the photoresist by using a mask, wherein the mask comprises at least one of a light transmissible pattern, light partially-transmissible patterns having N light transmittances or a light shielding pattern, and N is an integer larger than or equal to 1;
   performing a development process and forming photoresist-reserved regions having N+1 different thicknesses and a photoresist-removed region;
   etching a part, corresponding to the photoresist removed region, of the layer of gate insulation layer material;
   removing the photoresist corresponding to a photoresist-reserved region having a minimum thickness among the photoresist-reserved regions having N+1 thicknesses; and etching a region, corresponding to the photoresist-reserved region having the minimum thickness, of the layer of gate insulation layer material, and repeating steps of removing the photoresist corresponding to the photoresist-reserved region having the minimum thickness and etching the region, corresponding to the photoresist-reserved region having the minimum thickness, of the layer of gate insulation layer material, until one photoresist-reserved region having a thickness is left;
   removing residual photoresist at a region, corresponding to the left one photoresist-reserved region having the thickness, of the layer of gate insulation layer material to form the gate insulation layers having N+1 thicknesses.

2. The method according to claim 1, wherein manufacturing the plurality of gate insulation layers having different thicknesses on the base substrate in one patterning process, comprises:
   manufacturing the plurality of gate insulation layers having different thicknesses and an active layer on the base substrate in one patterning process.

3. The method according to claim 2, wherein manufacturing the plurality of gate insulation layers having different thicknesses and the active layer on the base substrate in one patterning process, comprises:
   forming a layer of active layer material and a layer of gate insulation layer material on the base substrate sequentially;
   coating photoresist on the layer of gate insulation layer material;
   exposing the photoresist by using a mask, wherein the mask comprises at least one of a light transmissible pattern, light partially-transmissible patterns having N+1 light transmittances or a light shielding pattern, and N is an integer larger than or equal to 1;
   performing a development process and forming photoresist-reserved regions having N+2 thicknesses and a photoresist-removed region;
   etching a part, corresponding to the photoresist removed region, of the layer of active layer material;
   removing the photoresist corresponding to a photoresist-reserved region having a minimum thickness among the photoresist-reserved regions having N+2 thicknesses; etching a region, corresponding to the photoresist-reserved region having the minimum thickness, of the layer of gate insulation layer material; and repeating the steps of removing the photoresist corresponding to the photoresist-reserved region having the minimum thickness, and etching the region, corresponding to the photoresist-reserved region having the minimum thickness, of the layer of gate insulation layer material, until one photoresist reserved region having a thickness is left;

removing residual photoresist at a region, corresponding to the left one photoresist-reserved region having the thickness, of the layer of gate insulation layer material and forming the gate insulation layers having N+1 thicknesses.

4. The method according to claim 3, wherein, after forming the gate insulation layers having N+1 thicknesses, the method further comprises:

performing, an electrically-conductive processing on a region, uncovered by the gate insulation layers, of the layer of active layer material to form a source contact region and a drain contact region of the active layer.

5. The method according to claim 4, wherein after forming the gate insulation layers having N+1 thicknesses, the method further comprises:

forming an electrically-conductive layer on the base substrate having the gate insulation layers having N+1 thicknesses;

forming a source electrode, a drain electrode and a gate electrode of a thin film transistor based on the electrically-conductive layer in one patterning process, wherein the source electrode, the drain electrode and the gate electrode of the thin film transistor are insulated from each other.

6. The method according to claim 5, wherein the electrically-conductive layer is a single-layer structure or a multi-layer structure.

7. A display substrate, manufactured by using the method of claim 1, comprising:

a plurality of sub-pixels having different colors, wherein thicknesses of gate insulation layers of thin film transistors comprised in the sub-pixels having different colors are different.

8. The display substrate according to claim 7, wherein the plurality of sub-pixels having different colors comprises at least a sub-pixel having a first color and a sub-pixel having a second color; the sub-pixel having the first color comprises a first thin film transistor, the sub-pixel having the second color comprises a second thin film transistor, and a transmittance of a color film having the first color to white light is smaller than that of a color film having the second color to the white light; and a thickness of a gate insulation layer of the first thin film transistor is smaller than that of a gate insulation layer of the second thin film transistor.

9. The display substrate according to claim 7, wherein each of the first thin film transistor or the second thin film transistor comprises specifically:

an active layer on a base substrate, wherein the active layer comprises a source contact region, a drain contact region, and a channel region between the source contact region and the drain contact region;

a gate insulation layer on the channel region;

a source electrode on the source contact region;

a drain electrode on the drain contact region; and a gate electrode on the gate insulation layer.

10. A display device, comprising:

the display substrate according to claim 7.

* * * * *